(12) United States Patent
Okamoto

(10) Patent No.: US 6,545,304 B2
(45) Date of Patent: Apr. 8, 2003

(54) SOLID-STATE IMAGE PICKUP DEVICE

(75) Inventor: Eiichi Okamoto, Miyagi (JP)

(73) Assignee: Fuji Photo Film Co., Ltd., Nakanuma (JP)

(*) Notice: Subject to any disclaimer, the term of this patent is extended or adjusted under 35 U.S.C. 154(b) by 0 days.

(21) Appl. No.: 09/726,534

(22) Filed: Dec. 1, 2000

(65) Prior Publication Data
US 2001/0048124 A1 Dec. 6, 2001

(30) Foreign Application Priority Data
Dec. 6, 1999 (JP) .......................... 11-346479

(51) Int. Cl.[7] .................. H01L 27/148; H01L 29/768
(52) U.S. Cl. ................ 257/291; 257/222; 257/225; 257/231; 257/232; 257/233; 257/241; 257/243
(58) Field of Search ................ 257/222, 231, 257/225, 291, 292, 232, 233, 241, 243

(56) References Cited

U.S. PATENT DOCUMENTS

| | | | | |
|---|---|---|---|---|
| 5,181,093 A | * | 1/1993 | Kawaura | 257/223 |
| 5,241,198 A | * | 8/1993 | Okada et al. | 257/215 |
| 5,514,887 A | * | 5/1996 | Hokari | 257/222 |
| 5,744,831 A | * | 4/1998 | Tanaka | 257/225 |
| 6,215,139 B1 | * | 4/2001 | Iida et al. | 257/291 |

FOREIGN PATENT DOCUMENTS

| | | | |
|---|---|---|---|
| DE | 019810072 A1 | * | 12/1998 |
| JP | 403125475 A | * | 5/1991 |

* cited by examiner

Primary Examiner—Jerome Jackson
Assistant Examiner—Joseph Nguyen
(74) Attorney, Agent, or Firm—Arent Fox Kintner Plotkin & Kahn, PLLC

(57) ABSTRACT

In production of a solid-state image pickup device including a semiconductor substrate, a photoelectric converter element group including a plurality of photoelectric converter elements formed in one column in one surface of the semiconductor substrate, a charge transfer path to transfer signal charge accumulated in the photoelectric converter elements, and readout gates to read signal charge from photoelectric converter elements to feed the charge to the charge transfer path, an ON or ONO film electrically insulates each transfer electrode constituting the charge transfer path from the semiconductor substrate and an oxide insulating film insulates a readout gate electrode constituting the readout gate from the semiconductor substrate to thereby improve electric characteristics of the solid-state image pickup device.

4 Claims, 11 Drawing Sheets

FIG. 4
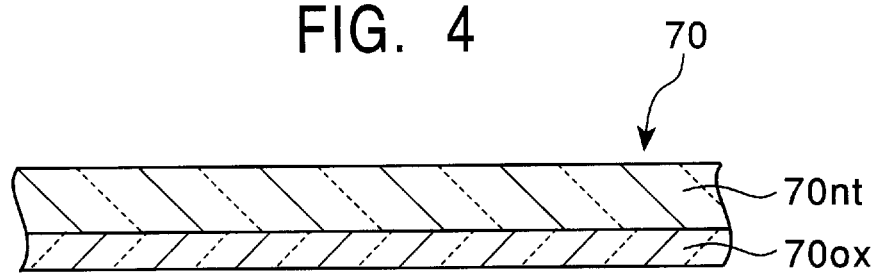
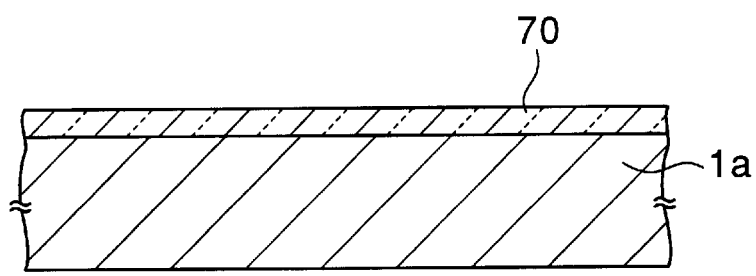
FIG. 5A
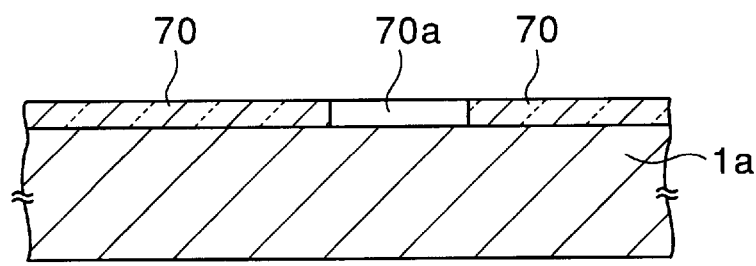
FIG. 5B
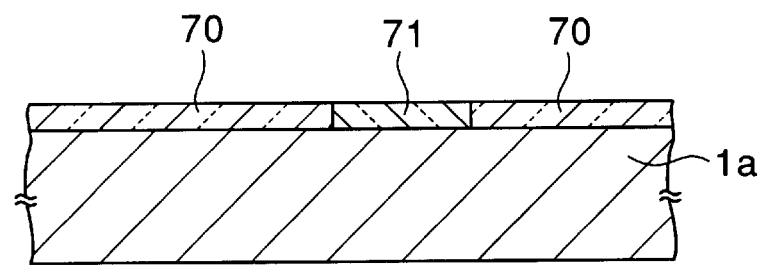
FIG. 5C
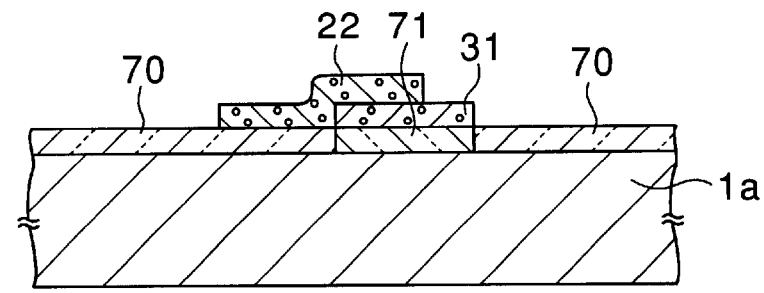
FIG. 5D

SOLID-STATE IMAGE PICKUP DEVICE

This application is based on Japanese Patent Application HEI 11-346479 filed on Dec. 6, 1999, the entire contents of which are incorporated herein by reference.

BACKGROUND OF THE INVENTION a) Field of the Invention

The present invention relates to a solid-state image pickup device of CCD type and a method of producing the same.

b) Description of the Related Art

Since a mass-production technique of a charge-coupled device (CCD) has been developed, there have increasingly appeared apparatuses in which a solid-state image pickup device of CCD type (to be simply referred to as a solid-state image pickup device herebelow) is used as a line sensor (linear sensor) or an area image sensor.

A solid-state image pickup device for a line sensor includes a group of photoelectric converter elements formed in a line in a semiconductor substrate, a charge transfer path formed adjacent to the group of photoelectric converter elements on the substrate, and a plurality of readout gates to read signal charge from the photoelectric converter elements to feed the signal charge to the charge transfer path. When necessary, discharge gates are arranged to form an overflow drain of horizontal type.

The photoelectric converter element is generally composed of a photodiode.

The charge transfer path in the solid-state image pickup device for a line sensor is composed, for example, of a CCD of two-phase driving type. The charge transfer path includes a charge transfer channel formed in the semiconductor substrate and a plurality of transfer electrodes intersecting or crossing the charge transfer channel in a plan view.

The charge transfer channel includes, for example, two potential barrier regions and two potential well regions (storage regions) for one photoelectric converter element. The potential barrier and well regions are alternately formed in this order beginning at a position on an upstream side.

In this specification, movement of the charge through the charge transfer path is assumed to be a flow and a relative position of each constituent member or the like of the solid-state image pickup device is expressed as, for example, "downstream of member X" or "upstream of member Y".

Each transfer electrode constituting the charge transfer path is arranged over the potential barrier or well region. Among four transfer electrodes arranged for one photoelectric converter element, two upstream transfer electrodes are commonly connected to each other and two downstream transfer electrodes are commonly connected to each other.

One readout gate is formed for each photoelectric converter element. Each readout gate includes a readout gate region formed in the semiconductor substrate to be contiguous to the associated photoelectric converter element and an associated charge transfer channel, and a readout gate electrode formed over the readout gate region. The readout gate electrodes are electrically connected to each other to constitute one electrode line.

Signal charge transferred through the charge transfer path is sent from the transfer path, for example, via an output gate or directly to a floating diffusion section or region. The signal charge is fed from the floating diffusion section to a predetermined source follower circuit. The signal charge is amplified by and is then outputted from the source follower circuit.

A reset transistor is formed using the floating diffusion section. The signal charge after the amplification (detection) is absorbed via a drain region of the reset transistor into a power source.

On the other hand, the solid-state image pickup device for an area image sensor includes a plurality of constituent units each of which includes (i) a group of photoelectric converter elements, (ii) a charge transfer channel, and (iii) one readout gate for each photoelectric converter element. A predetermined number of transfer electrodes are formed to intersect the charge transfer channel of each unit in a plan view.

One charge transfer channel and the transfer electrodes intersecting the charge transfer channel of each unit in a plan view constitute one charge transfer path. In an intersection region between each charge transfer channel and each transfer electrode in a plan view, a charge transfer stage is formed.

The transfer electrodes are composed only of transfer electrodes (to be referred to as readout transfer electrodes herebelow) each of which includes a section also serving as a readout gate electrode. Or, the transfer electrodes are composed of a plurality of transfer electrodes (to be referred to as transfer dedicated electrodes herebelow) each of which does not function as a readout gate electrode and a plurality of readout/transfer electrodes. The configuration of the transfer electrodes is decided based on a specification of arrangement of the photoelectric converter elements or the like.

The number of transfer electrodes for each photoelectric converter element is appropriately determined according to a specification of arrangement of the photoelectric converter elements, a method of driving the charge transfer paths, and the like. The charge transfer path is composed of a CCD of, for example, three-phase, four-phase, or eight-phase driving type.

The solid-state image pickup device for an area image sensor further includes an output transfer path. The output transfer path is connected to each of the charge transfer paths. The output transfer path is composed of a CCD of, for example, three-phase or four-phase driving type.

At a downstream end section of the output transfer path, a floating diffusion section is formed. The section is a constituent component of a reset transistor. When necessary, a discharge gate is disposed to form a horizontal overflow drain.

In the solid-state image pickup device for a line sensor, each transfer electrode, each readout gate electrode, each discharge gate electrode, and the gate electrode of the reset transistor are formed on a semiconductor substrate with an electrically insulating film between each of the electrodes and the semiconductor substrate. This also applies to the solid-state image pickup device for an area image sensor.

The semiconductor substrate of the solid-state image pickup device is a silicon substrate or a complex substrate in which a silicon layer is formed on one surface of a substrate made of quartz glass, or the like in general. The electrically insulating film to electrically isolate the semiconductor substrate from each transfer electrode and each gate electrode is, for example, a film made of silicon oxide, an ON film or, an ONO film.

In this specification, the ON film indicates a two-layer electronically insulating film being composed of an oxide layer formed on the semiconductor substrate and a nitride layer formed on the oxide layer. The ONO film indicates a three-layer electronically insulating film being composed of an oxide layer formed on the semiconductor substrate, a nitride layer formed on the oxide layer, and an oxide layer formed on the nitride layer.

Each of the electrodes is made of, for example, a first layer of polycrystalline silicon (1-polysilicon layer) or a second layer of polycrystalline silicon (2-polysilicon layer).

In the electrode constitution, when a film of silicon oxide (to be referred to as "insulating film I" in some cases herebelow) to electrically the electrodes from the semiconductor substrate is beforehand disposed on the semiconductor substrate, two phenomena or events may possibly occur as follows.

In a process to form an oxidized surface-layer of the 1-polysilicon layer to electrically isolate an electrode made of the 1-polysilicon layer from an electrode made of a 2-polysilicon layer, an insulating film I grows at a location in which the 2-polysilicon layer is to be formed. Resultantly, film thickness of the insulating film I below, the electrode made of the 2-polysilicon layer become greater than that of the insulating film I below the electrode made of the 1-polysilicon layer. This phenomenon will be referred to as phenomenon A1 herebelow.

In the process to form the oxidized surface-layer, the insulating film I grows below an end section of the 1-polysilicon layer and peels or warps an edge of the end section of the 1-polysilicon layer. This phenomenon will be referred to as phenomenon A2 herebelow. Phenomena A1 and A2 will be collectively referred to as "phenomenon A" herebelow.

When phenomenon A occurs in the production of a solid-state image pickup device for a line sensor, a threshold voltage for a desired operation varies between the transfer electrodes or between the readout gates. Resultantly, a line sensor having desired electric characteristics cannot be obtained. For example, transfer efficiency is lowered. The electric characteristics vary between the line sensors in some cases. This is also the case with a solid-state image pickup device for an area image sensor.

Therefore, when it is desired to form an electrode using a 1-polysilicon layer and an electrode using a 2-polysilicon layer on a semiconductor substrate, ON film or ONO film is often used as a material of the insulating film to insulate the electrodes from the semiconductor substrate.

The ON film used for the insulating film prevents phenomenon A in the forming of the oxidized surface-layer of the 1-polysilicon layer.

Also the ONO film used for the insulating film can prevent phenomenon A in the forming of the oxidized surface-layer of the 1-polysilicon layer.

To feed signal charge from a photoelectric converter element to the charge transfer path, a readout pulse having a relatively high voltage of, for example, about 15 V is applied to the readout gate electrode. A relatively high voltage of, a relatively high voltage ranging, for example, from 10 V to 20 V is also applied to the discharge gate electrode to discharge unnecessary charge and to the gate electrode of the reset transistor to discharge the charge after the amplification (detection).

When such a high voltage is applied to an electrode formed on the ON film, electrons are possibly trapped in the nitride film of the ON film or in a phase boundary between the nitride film and the oxide film of the ON film. This is also the case with a solid-state image pickup device in which an electrically insulating film made of an ONO film is used.

When electrons are trapped in the insulating film made of the ON or ONO film, the potential of each readout gate is changed in a solid-state image pickup device for a line sensor. For solid-state image pickup device for an area image sensor, the potential of each charge transfer stage constituted with a readout/transfer electrode or the potential of each readout gate is changed.

This results in variations in electric characteristics of the solid-state image pickup device. For example, a threshold voltage to drive the device changes with a lapse of time.

SUMMARY OF THE INVENTION

It is therefore an object of the present invention to provide a solid-state image pickup device in which variations in electric characteristics can be easily suppressed.

Another object of the present invention is to provide a method of producing a solid,-state image pickup device in which variations in electric characteristics can be easily suppressed.

According to one aspect of the present invention, there is provided a solid-state image pickup device, comprising: a semiconductor substrate; a photoelectric converter element group including a plurality of photoelectric converter elements formed in one column in one surface of said semiconductor substrate; a charge transfer channel formed in said semiconductor substrate, said charge transfer channel being adjacent to said photoelectric converter element group; a readout gate region formed for each said photoelectric converter element, each said readout gate region being contiguous to said associated photoelectric converter element and to said charge transfer channel; a plurality of transfer electrodes formed over said charge transfer channel with an ON film or an ONO film therebetween, each said transfer electrode intersecting said charge transfer channel in a plan view, said transfer electrodes being formed adjacent to each other and constituting one charge transfer path together with said charge transfer channel; and a readout gate electrode formed for each said readout gate region, each said readout gate electrode being formed over said associated readout gate region with an oxide insulating film therebetween, said readout gate electrodes being electrically connected to each other to form one electrode line.

According to another aspect of the present invention, there is provided a solid-state image pickup device, comprising: a semiconductor substrate; a plurality of photoelectric converter element groups formed in one surface of said semiconductor substrate, each said photoelectric converter element group including a plurality of photoelectric converter elements formed in one column in said semiconductor substrate; a charge transfer channel formed in said semiconductor substrate for each said photoelectric converter element group, said charge transfer channel being adjacent to said associated photoelectric converter element group; a readout gate region formed for each said photoelectric converter elements, each said readout gate region being contiguous to said associated photoelectric converter element and to one of said charge transfer channels; a plurality of transfer electrodes formed for each said charge transfer channel, each said transfer electrode being formed over each associated one of said charge transfer channels with an ON film or an ONO film therebetween, said transfer electrodes corresponding to one of said charge transfer channels being adjacent to each other and intersecting said one charge transfer channel in a plan view, said transfer electrodes corresponding to said one charge transfer channel constituting one charge transfer path together with said one charge transfer channel; and a readout gate electrode formed for each said readout gate region, each said readout gate electrode being formed over said associated readout gate region with an oxide insulating film therebetween, said readout gate electrodes corresponding to said photoelectric converter elements belonging to one of said photoelectric converter element groups being electrically connected to each other to form one electrode line.

According to still another aspect of the present invention, there is provided a method of producing a solid-state image pickup device, comprising: a preparation step of preparing a semiconductor substrate including in one surface thereof (a) a photoelectric converter element group including a plurality of photoelectric converter elements formed in one column, (b) a charge transfer channel formed adjacent to said photoelectric converter element group, and (c) a readout gate region formed for each said photoelectric converter element, each said readout gate region being contiguous to said associated photoelectric converter element and to said charge transfer channel; a lamination film forming step of forming an ON film or an ONO film on said one surface of said semiconductor substrate; a depression region forming step for locally removing at least a nitride layer from the ON film or a nitride layer and an oxide layer on the nitride layer from the ONO film and thereby forming a first depression region over the readout gate regions; an oxide insulating film forming step of forming an oxide insulating film on a bottom surface of the first depression region or forming an oxide insulating film by growing an oxide layer of a bottom of the first depression region; and an electrode forming step of forming, on the ON film or the ONO film, a plurality of transfer electrodes intersecting said charge transfer channel in a plan view and forming a readout gate electrode on the oxide insulating film for each said readout gate region.

According to still another aspect of the present invention, there is provided a method of producing a solid-state image pickup device, comprising: a preparation step of preparing a semiconductor substrate including in one surface thereof (a) a plurality of photoelectric converter element groups formed in the semiconductor substrate, each of the photoelectric converter element groups including a plurality of photoelectric converter elements formed in one column in the semiconductor substrate, (b) a charge transfer channel formed in the semiconductor substrate for each said photoelectric converter element group, the charge transfer channel being adjacent to the associated photoelectric converter element group, and (c) a readout gate region formed for each said photoelectric converter element, each of the readout gate regions being contiguous to the associated photoelectric converter element and to one of the charge transfer channels; a lamination film forming step of forming an ON film or an ONO film on said one surface of the substrate; a depression region forming step for locally removing at least a nitride layer from the ON film or a nitride layer and an oxide layer on the nitride layer from the ONO film and thereby forming a first depression region over each of the readout gate regions; an oxide insulating film forming step of forming an oxide insulating film on a bottom surface of the first depression region or forming an oxide insulating film by growing an oxide layer in a bottom of the first depression region; and an electrode forming step of forming a plurality of transfer electrodes over each of the charge transfer channels with the ON film or the ONO film therebetween, the transfer electrodes intersecting an associated charge transfer channel in a plan view and forming a readout gate electrode over each said readout gate region with the oxide insulating film therebetween.

In the above mentioned solid-state image pickup devices, each readout gate electrode is electrically isolated from the semiconductor substrate by the oxide insulating film. Consequently, there rarely occurs the event in which when a readout pulse is applied to the readout gate electrode, electrons are trapped by the insulating film (oxide insulating film) below the electrode.

Each transfer electrode is formed on the ON or ONO film. Therefore, at least occurrence of the phenomenon A2 can be suppressed even when the semiconductor substrate is a silicon substrate and each transfer electrode and each readout gate electrode are made of polycrystalline silicon layers. Phenomena A1 and A2, i.e., phenomenon A can be suppressed by using the 1-polysilicon layer for the readout gate electrode.

In consequence, it is possible in the solid-state image pickup device to easily suppress variations in electric characteristics thereof with a lapse of time. Between solid-state image pickup devices, variations in the electric characteristics thereof can be easily minimized.

According to still another aspect of the present invention, there is provided a solid-state image pickup device, comprising: a semiconductor substrate; a photoelectric converter element group including a plurality of photoelectric converter elements formed in one column in one surface of said semiconductor substrate; a charge transfer channel formed in said semiconductor substrate, said charge transfer channel being adjacent to said photoelectric converter element group; a readout gate region formed for each said photoelectric converter element, each said readout gate region being contiguous to said associated photoelectric converter element and to said charge transfer channel; a plurality of read/transfer electrodes intersecting said charge transfer channel in a plan view, each read/transfer electrode including a readout gate electrode section which covers said readout gate region in a plan view and which constitutes one readout gate together with said readout gate region and a transfer stage forming section which covers part of said charge transfer channel in a plan view and which constitutes one charge transfer stage together with said charge transfer channel, said one charge transfer stage being contiguous to said readout gate; a plurality of transfer dedicated electrodes intersecting said charge transfer channel in a plan view, said readout/transfer electrode and said transfer dedicated electrode being alternately formed, each said transfer dedicated electrode including a transfer stage forming section which covers part of said charge transfer channel in a plan view and which constitutes a charge transfer stage together with said charge transfer channel; an oxide insulating film intervening between said readout gate electrode section and said semiconductor substrate and between said transfer stage forming section in said readout/transfer electrode and said semiconductor substrate; and an ON film or an ONO film intervening between said transfer stage forming section in said transfer dedicated electrode and said semiconductor substrate.

In the above mentioned solid-state image pickup device, each readout gate electrode region is electrically isolated from the semiconductor substrate by the oxide insulating film. In the readout/transfer electrode, each transfer stage forming section is also electrically isolated from the semiconductor substrate by the oxide insulating film. Consequently, there rarely occurs the event in which when a readout pulse is applied to the readout/transfer gate electrode, electrons are trapped by the insulating film (oxide insulating film) below the electrode.

The transfer stage forming section in the transfer dedicated electrode is formed on the ON or ONO film. Therefore, even when the semiconductor substrate is a silicon substrate and each read/transfer electrode and each transfer dedicated electrode are made of polycrystalline silicon layers, at least occurrence of the phenomenon A2 can be suppressed. Phenomena A1 and A2, i.e., phenomenon A can be suppressed by using the 1-polysilicon layer for the readout/transfer gate electrode.

In consequence, it is possible in the solid-state image pickup device to easily suppress variations in electric characteristics thereof with a lapse of time. Between solid-state image pickup devices, variations in the electric characteristics thereof can be easily minimized.

BRIEF DESCRIPTION OF THE DRAWINGS

The objects and features of the present invention will become more apparent from the consideration of the following detailed description taken in conjunction with the accompanying drawings in which:

FIG. 4 is a cross-sectional view schematically showing an ON film;

FIGS. 5A to 5D are cross-sectional views for conceptually explaining an example of processes to produce the solid-state image pickup device of the first embodiment;

DESCRIPTION OF THE PREFERRED EMBODIMENTS

Figure 1:
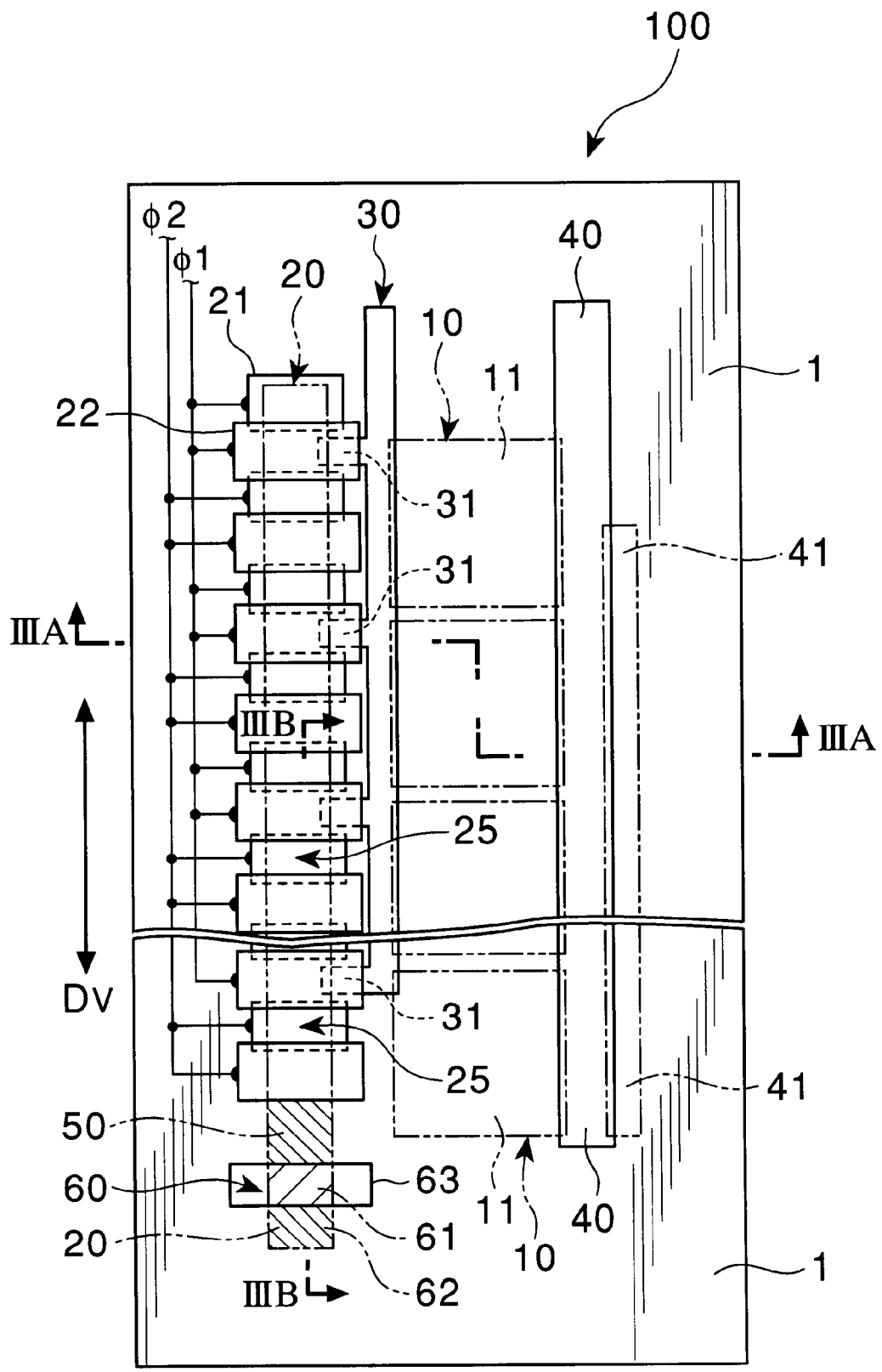
FIG. 1 is a plan view schematically showing a solid-state image pickup device according to a first embodiment.

Referring now to the drawings, description will be given of embodiments of the present invention.

FIG. 1 illustratively shows a solid-state image pickup device 100 according to a first embodiment in a plan view. The device 100 is particularly suitable for a solid-state image pickup device for a line sensor.

As shown in FIG. 1, the image pickup device 100 includes one photoelectric converter element group 10 being composed of a predetermined number of photoelectric converter elements 11 formed in one line or column in one surface of a semiconductor substrate 1. Five photoelectric converter elements 11 including those partly shown are shown in FIG. 1.

In an actual monochrome line sensor, at least one line or column of photoelectric converter elements including one group of or two groups of photoelectric converter elements are formed. In an actual color line sensor, for example, one or three line(s) or column(s) of photoelectric converter elements, each line or column includes a group of or two groups of photoelectric converter elements, are formed. The total number of photoelectric converter elements is, for example, about 1000 to about 20000 in a line sensor.

When a predetermined number of photoelectric converter elements are subdivided into two groups to be arranged in one column, for example, one group includes odd photoelectric converter elements and another group includes even photoelectric converter elements.

Adjacent to the photoelectric converter element group 10, a charge transfer channel 20 is formed on the left side of the group 10 in FIG. 1. The channel 20 extends in a direction $D_y$ (indicated by an arrow mark in FIG. 1).

For one photoelectric converter element 11, two transfer electrodes 21 and two transfer electrodes 22 are formed. The electrodes 21 and 22 are alternately formed in this order beginning at an upstream position. In FIG. 1, each transfer electrode 21 is formed using a 1-polysilicon layer formed on the semiconductor substrate 1 with an insulating film (not shown) therebetween. Each transfer electrode 22 is formed using a 2-polysilicon layer formed on the semiconductor substrate 1 with an insulating film (not shown) therebetween. Two transfer electrodes 21 and 22, which are adjacent to each other, are electrically insulated from each other by an oxidized surface-layer (silicon oxide film) formed on a surface of the transfer electrode 21. Each of the transfer electrodes 21 and 22 intersects a charge transfer channel 20 in a plan view.

The charge transfer channel 20 constitutes one charge transfer path 25 together with the transfer electrodes 21 and the transfer electrodes 22. The charge transfer path 25 is a two-phase-driving CCD to be driven by two-phase driving signals $\phi 1$ and $\phi 2$.

Between each photoelectric converter element 11 and the charge transfer channel 20 in a plan view, one readout gate electrode 31 is formed for each photoelectric converter element 11. The readout gate electrodes 31 are electrically connected to each other to form one readout gate electrode line 30. The line 30 is constituted with a 1-polysilicon layer. An oxidized surface-layer (silicon oxide film) is formed on a surface of the readout gate electrode line 30. End sections respectively of the readout gate electrodes 31 on the charge transfer channel side 20 overlap with mutually different transfer electrodes 22 in a plan view.

Adjacent to the photoelectric converter element group 10, one discharge drain region 41 is formed on the right side of the group 10 in FIG. 1. The region 41 has a contour like a band and extends in the direction $D_y$.

Between each photoelectric converter element 11 and the discharge drain region 41 in a plan view, one discharge gate electrode line 40 is arranged. The line 40 has a contour like a band and extends in the direction $D_y$. The line 40 is constructed using, for example, a 1-polysilicon layer. An oxidized surface-layer (silicon oxide film) is formed on a surface of the discharge gate electrode line 40.

In a downstream location of the charge transfer channel 20, a floating diffusion region 50 is formed. On the downstream side of the region 50, a reset transistor gate region 61 and a reset transistor drain region 62 are formed in this order. In FIG. 1, these regions are hatched for easy understanding.

A reset transistor gate electrode 63 intersects the reset transistor gate region 61 in a plan view. The gate electrode 63 is formed using, for example, a 1-polysilicon layer. An oxidized surface-layer (silicon oxide film) is formed on a surface of the reset transistor gate electrode 63.

The floating diffusion region 50, the reset transistor gate region 61, the reset transistor drain region 62, and the reset transistor gate electrode 63 constitute one reset transistor 60.

Figure 2:
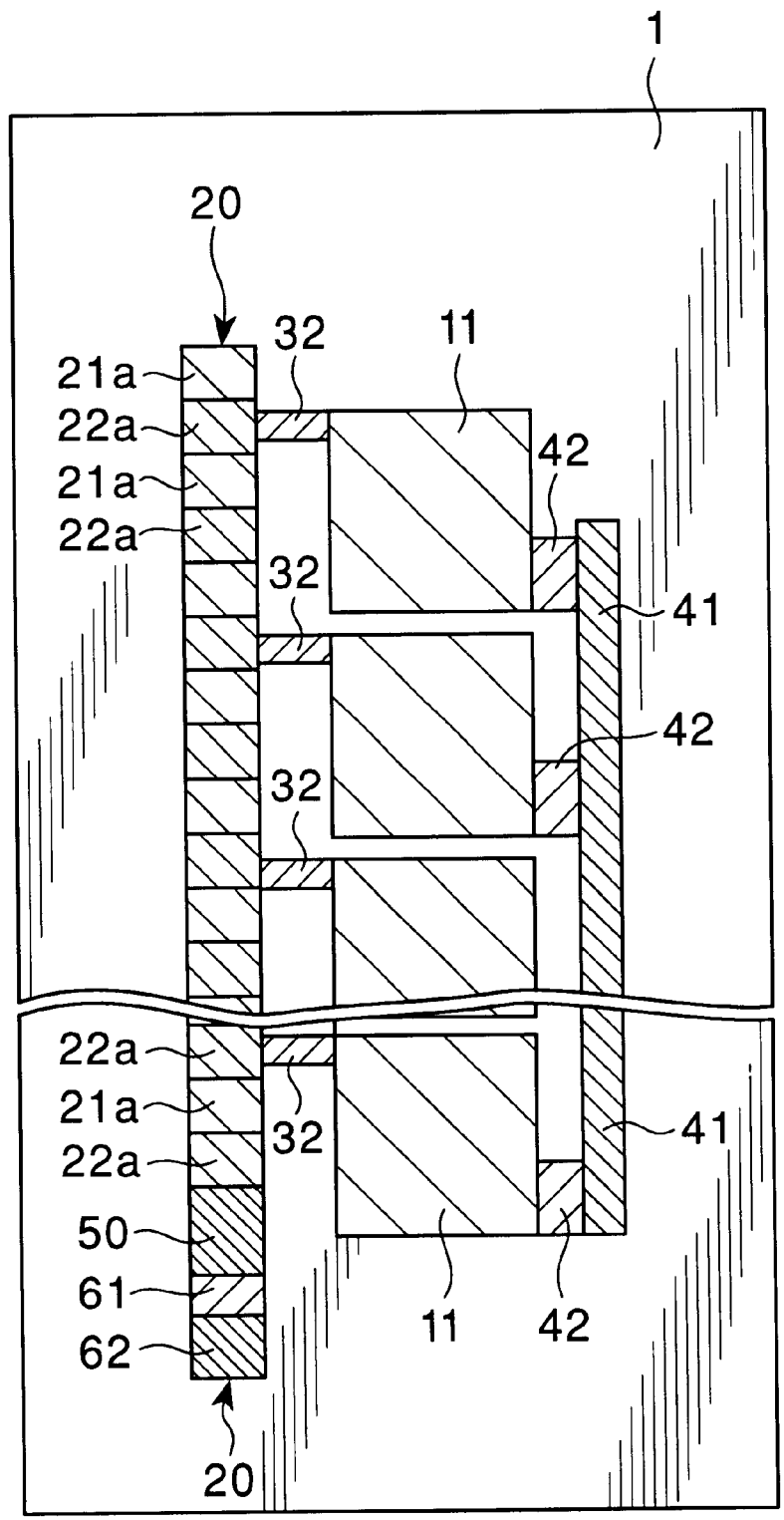
FIG. 2 is a plan view schematically showing a layout of a group of photoelectric converter elements, charge transfer channels, readout gate regions, and the like in a semiconductor substrate of the solid-state image pickup device of the first embodiment.

Referring next to FIG. 2, description will be given of a layout of the photoelectric converter element group 10, the charge transfer channel 20, the readout gate regions 32, the discharge drain region 41, the discharge gate regions 42, the floating diffusion region 50, the reset transistor gate region 61, and the reset transistor drain region 62 on the semiconductor substrate 1 in a plan view.

In the description below, the semiconductor substrate 1 is an n-type silicon substrate having a p-type well. However, the present invention is not limited only to the following configuration.

When the semiconductor substrate 1 is an n-type silicon substrate having a p-type well, the charge transfer channel 20 is formed by arranging, for example, an n$^-$-type region, an n-type region, and an n$^+$-type region in a desired location of the p-type well in a predetermined order.

Specifically, in a direction from an upstream end of the charge transfer channel 20 to a downstream end thereof, an n$^-$-type region 21a and an n-type region 22a are alternately formed in this order. For one photoelectric converter element 11, two n$^-$-type regions 21a and two n-type regions 22a are formed. A transfer electrode 21 (FIG. 1) is disposed over an n$^-$-type region 21a. A transfer electrode 22 (FIG. 1) is disposed over an n-type region 22a.

On the downstream side of a downstream one of the two n-type regions 22a corresponding to the photoelectric converter element at a most downstream position, a floating diffusion region 50 of, for example, an n$^+$-type region, a reset transistor gate region, 61, for example, an n-type region and a reset transistor drain region 62 of, for example, an n$^+$-type region are formed in this order.

Adjacent to either one of two n-type regions 22a formed for one photoelectric converter element 11, one readout gate region 32 is formed. In the solid-state image pickup device 100, one readout gate region 32 is formed to be contiguous to an upstream one of the two n-type regions 22a corresponding to the photoelectric converter element 11.

Each readout gate region 32 is contiguous also to the associated photoelectric converter element 11. The region 32 is formed using, for example, a p-type region. A readout gate electrode (FIG. 1) is arranged over a readout gate region 32.

On the right side (on the right side in FIG. 2) of each photoelectric converter element 11, one discharge gate region 42 is formed to be contiguous to the element 11. The region 42 is formed using, for example, a p-type region. Each discharge gate,region 42 is covered with the discharge gate electrode line 40 (FIG. 1) in a plan view. Each section of the discharge gate electrode line 40 over the discharge gate region 42 in a plan view corresponds to a discharge gate electrode, which will be described later.

The discharge drain region 41 is formed on the right side (in FIG. 2) of each discharge gate region 42 to be contiguous to the region 42. The discharge drain region 41 is formed using, for example, an n$^+$-type region.

The solid-state image pickup device shown in FIGS. 1 and 2 operates, for example, as follows.

When light enters the photoelectric converter element 11, signal charge is accumulated in the element 11. When a readout pulse (of, for example, 15 V) is applied to the readout gate electrode line 30 shown in FIG. 1, potential of the readout gate region 32 below each readout gate electrode 31 decreases, and a conductive state is established between the element 11 and the charge transfer path 25. The signal charge stored in the photoelectric converter element 11 is then read out to the charge transfer path 25.

By appropriately selecting the waveforms of the driving signals $\phi 1$ and $\phi 2$ to be supplied to the charge transfer path 25, the signal charge in the charge transfer path 25 can be sequentially transferred toward the floating diffusion region 50. The signal charge transferred to the region 50 is then supplied from the region 50 to a predetermined source follower circuit (not shown). The signal charge is amplified by the circuit and is outputted therefrom. The signal charge after the amplification (detection) is absorbed via the reset transistor drain region 62 of the reset transistor 60 into, a power source.

When unnecessary charge is distributed in the photoelectric converter element 11, a predetermined voltage can be applied to the discharge gate electrode line 40 shown in FIG. 1. This can lower potential of the discharge gate region 42 below a discharge gate electrode 40a, which will be described later, and hence a passage for charge is established between the photoelectric converter element 11 and the discharge drain region 41. Therefore, unnecessary charge distributed in the photoelectric converter element 11 can be discharged to the discharge drain region 41.

Features of the solid-state image pickup device 100 reside in the materials and layout specifications of the insulating films as described below.

Figure 3A:
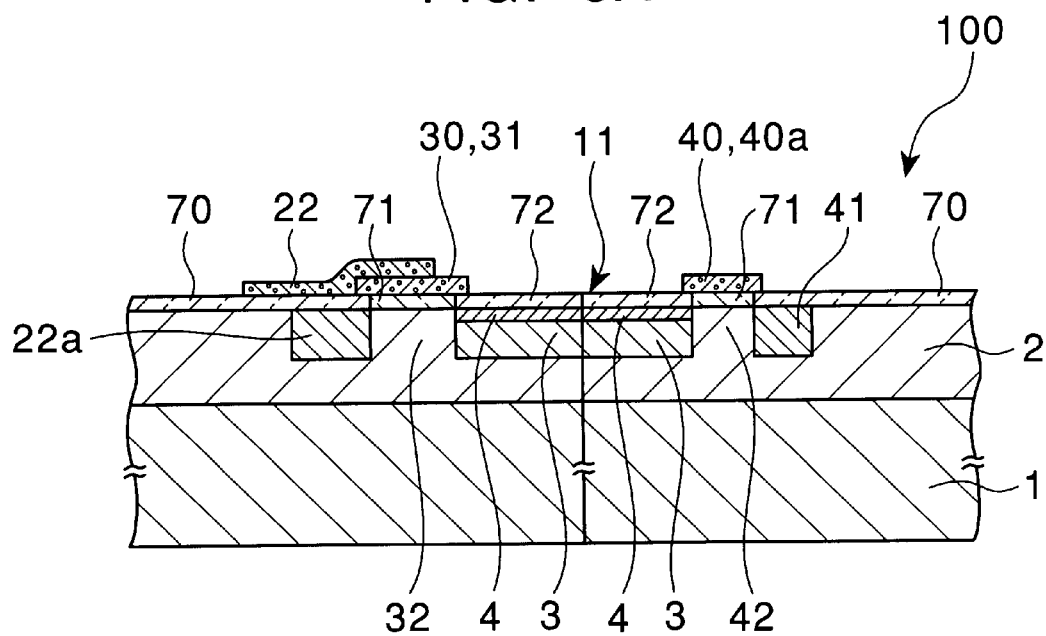
FIG. 3A is a schematic cross-sectional view of the solid-state image pickup device of the first embodiment along line IIIA—IIIA of FIG. 1.
Figure 3B:
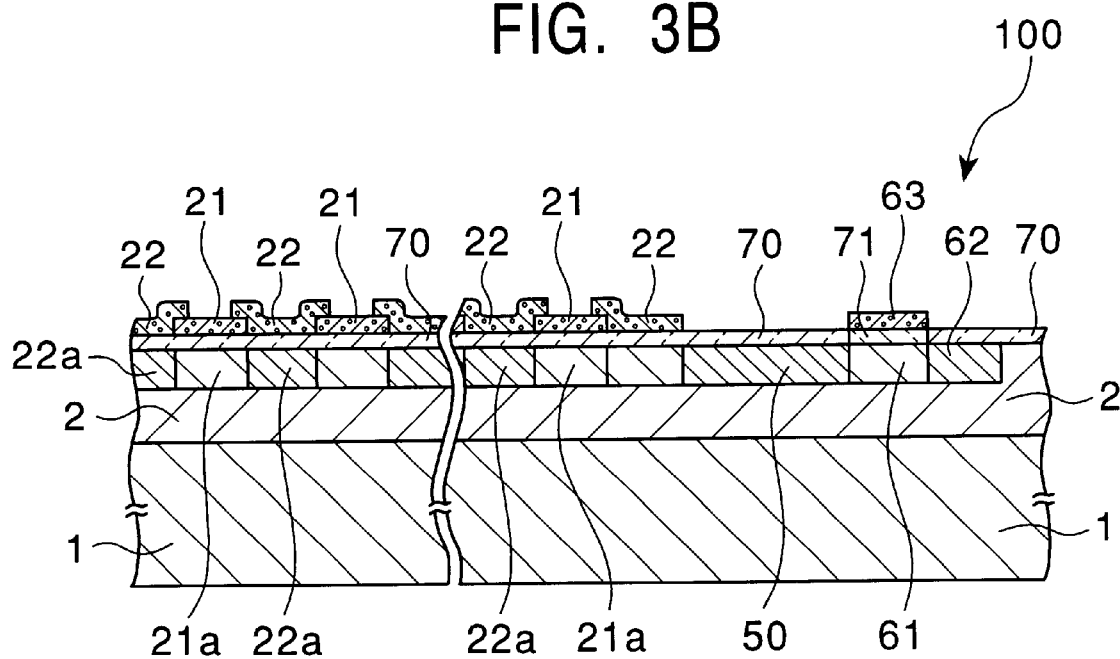
FIG. 3B is a schematic cross-sectional view of the solid-state image pickup device of the first embodiment along line IIIB—IIIB of FIG. 1.

Referring now to FIGS. 3A, 3B, and 4, description will be given of the materials and !layout specifications of the insulating films.

FIG. 3A schematically shows a cross-sectional view of the solid-state image pickup device 100 along line IIIA—IIIA shown in FIG. 1.

FIG. 3B schematically shows a cross-sectional view of the solid-state image pickup device 100 along line IIIB—IIIB shown in FIG. 1.

FIG. 4 schematically shows a cross-sectional view of an ON film.

As can be seen from FIG. 3A or 3B, the insulating film to electrically insulate the transfer electrodes 21 and 22 from the semiconductor substrate 1 is one ON film 70 in the solid-state image pickup device 100. On the other hand, each insulating film to electrically insulate each readout gate electrode 31, each discharge gate electrode 40a, and the gate electrode 63 of the reset transistor 60 from the semiconductor substrate 1 is a silicon oxide film 71.

As shown in FIG. 4, the insulating film constituted with the ON film 70 is formed with a silicon oxide film 70ox having a thickness of, for example, about 100 angstroms (Å) to about 500 Å (about 10 nanometers (nm) to about 50 nm) and a silicon. nitride film 70nt formed on the silicon oxide film 70ox. The silicon nitride film 70nt has a thickness of, for example, about 200 Å to about 700 Å (about 20 nm to about 70 nm). Thicknesses of the films 70ox and 70nt constituting the ON film 70 are appropriately determined according to, for example, use of the solid-state image pickup, device 100 and magnitude of voltages applied to the transfer electrodes 21 and 22. The ON film 70 has a thickness ranging from about 300 Å to about 1000 Å (about 30 nm to about 100 nm).

On the other hand, the insulating film constituted with the silicon oxide film 71 is a thermally oxidized film formed by thermal oxidation of a surface of the semiconductor substrate 1 constituted with a silicon substrate. Thickness of the silicon oxide film 71 is appropriately determined according to magnitude of voltages applied to the readout gate electrode 31, the discharge gate electrode 40a, and/or the gate electrode 63 of the reset transistor 60. The thickness ranges from about 300 Å to about 1000 Å (about 30 nm to about 100 nm).

When voltages applied to the readout gate electrode 31, the discharge gate electrode 40a, and the gate electrode 63 of the reset transistor 60 differ from each other, the thickness of the insulating film constituted with the silicon oxide film 71 may be determined for each of the gate electrodes when necessary.

The photoelectric converter element 11 shown in FIG. 3A is composed of a photodiode of buried type including an n-type region 3 formed in a predetermined location of a p-type well 2 in the semiconductor substrate 1 and a p$^+$-type region 4 formed on a surface of the n-type region 3.

On the photoelectric converter element 11, a silicon oxide film 72 formed by, for example, thermal oxidation or chemical vapor deposition (CVD), a silicon nitride film formed by plasma CVD or the like is disposed.

Although not shown in FIGS. 1, 2, 3A and 3B, a field oxide film or a p$^+$-type channel stop region is or both thereof are formed in isolation regions in a periphery of each photoelectric converter element 11, the charge transfer channel 20, each readout gate region 32, the discharge drain region 41, and each discharge gate region 42.

As above, in the solid-state image pickup device 100, each transfer electrode 21 constituted with a 1-polysilicon layer and each transfer electrode 22 constituted with, a 2-polysilicon layer are formed on the insulating film formed with the ON film 70. The readout gate electrode 31, the discharge gate electrode 40a, and the gate electrode 63 of the reset transistor 60 each of which is constituted with a 1-polysilicon layer are formed on the insulating film formed with the silicon oxide film 71.

Therefore, even when a relatively high voltage is applied to the readout gate electrode 31, the discharge gate electrode 40a, or the gate electrode 63 of the reset transistor 60, the phenomenon in which electrons are trapped by the insulating film (silicon oxide film 71) below the gate electrode rarely occurs.

Consequently, in the solid-state image pickup device 100, changes in the electric characteristics with a lapse of time can be easily suppressed.

The phenomenon in which the insulating film below each electrode constituted with the 2-polysilicon layer becomes thicker than that below each electrode constituted with the 1-polysilicon layer during the producing of the solid-state image pickup device 100 can be suppressed.

The phenomenon in which an edge section of each electrode constituted with the 1-polysilicon layer is peeled or warped during the production of the solid-state image pickup device 100 can be suppressed.

Therefore, in the solid-state image pickup device 100, the changes in electric characteristics with a lapse of time can be easily suppressed. When a plurality of solid-state image pickup devices 100 are produced, the variations in electric characteristics therebetween can be easily minimized.

Referring now to FIGS. 5A to 5D, description will be given of an example of a method of producing the solid-state image pickup device 100.

FIGS. 5A to 5D are schematic cross-sectional views to conceptually explain an example of a method of producing the solid-state image pickup device 100.

First, a semiconductor substrate (to be referred to as a "semiconductor substrate 1a" herebelow) is prepared in a preparation process. In a surface of the semiconductor substrate 1a, a photoelectric converter element group 10, a charge transfer channel 20, readout gate regions 32, a discharge drain region 41, discharge gate regions 42, a floating diffusion region 50, a reset transistor gate region 61, and a reset transistor drain region 62 are formed with an arrangement shown in FIG. 2. A field oxide film or channel stop region is beforehand formed in isolation region in a periphery of each photoelectric converter element 11, the charge transfer channel 20, each readout gate region 32, the discharge drain region 41, and each discharge gate region 42.

As can be seen from FIG. 5A, an ON film 70 is formed on an overall surface of the semiconductor substrate 1a on one side thereof in which the above mentioned regions are beforehand formed (lamination film forming process).

In the forming of the ON film 70, a silicon oxide layer 70ox (reference is to be made to FIG. 4) having a thickness of about 100 Å to about 500 Å (about 10 nm to about 50 nm) is formed by thermal oxidation or the like. The silicon oxide layer 70ox is formed, for example, in dry oxidizing atmosphere at a temperature of 850 degrees centigrade (°C.) to 1000° C.

On the silicon oxide layer 70ox, a silicon nitride layer 70nt (FIG. 4) having a thickness of about 200 Å to about 700 Å (about 20 nm to about 70 nm) is formed by vapor deposition or the like. The silicon nitride layer 70nt can be formed, for example, through chemical reaction between monosilane ($SiH_4$) and ammonia ($NH_3$) at a temperature ranging from 700° C. to 1000° C.

As shown in FIG. 5B, the ON film 70 is locally removed to form a first depression region 70a on each readout gate region 32, each discharge gate region 42, and the reset transistor gate region 61 (depression forming process).

The first depression region 70a may pass through the ON film 70 or may not pass therethrough. When the first depression region 70a does not pass through the ON film 70, at least the nitride layer (silicon nitride layer 70nt) is removed to expose the oxide layer (silicon oxide layer 70ox) therebelow. In FIG. 5B, the first depression region 70a passes through the ON film 70.

The first depression region 70a includes a predetermined number of opening(s) formed in the ON film 70. In one of the openings constituting the first depression region 70a, all readout gate regions 32 may be placed in a plan view. This is also the case with each discharge gate region 42. All readout gate regions 32 and/or all discharge gate regions 42 may be placed in one of the openings in a plan view.

To form the first depression region 70a including through-holes in the ON film 70, a resist pattern of a predetermined contour is, for example, first formed on the ON film 70 by photolithography or the like. A patterning process is conducted thereafter by dry etching in which the nitride layer (silicon nitride layer 70nt) constituting the ON film 70 is patterned into a predetermined shape using the resist pattern as an etching mask. The etching may be conducted using a mixture gas of, for example, tetrafluoromethane gas $CF_4$ and oxygen gas $O_2$.

In a subsequent patterning process, wet etching is conducted for the oxide layer (the silicon oxide layer 70ox constituting the ON film 70) exposed by removing the nitride layer (silicon nitride layer 70nt). The etching can be conducted using, for example, diluted hydrogen fluoride. Thereafter, the resist pattern is no longer necessary and is hence removed.

When the first depression region 70a does not pass through the ON film 70, the nitride layer (silicon nitride layer 70nt) is removed, for example, as above. After the resist pattern is then removed, an oxide insulating film is formed as follows. The oxide layer (silicon oxide layer 70ox) may be partially etched or may not be etched.

As shown in FIG. 5C, on a surface of the semiconductor substrate 1a exposed at a bottom section of the first depression region 70a or on a surface of the oxide layer (oxide layer, i.e., the silicon oxide layer 70ox constituting the ON film 70) exposed at a bottom section thereof, a silicon oxide film 71 is formed (oxide insulating film forming process). FIG. 5C shows an example of the first depression region 70a in which a surface of the semiconductor substrate 1a is exposed in a bottom section thereof.

The silicon oxide film 71 can be formed, for example, by dry oxidation at a temperature of about 900° C. to about 1100° C. or by wet oxidation at a temperature of about 850° C. to about 1000° C.

When the first depression region 70a does not pass through the ON film 70, the silicon oxide film 71 may be formed by growing the oxide layer (oxide layer, i.e., the silicon oxide layer 70ox constituting the ON film 70) forming a bottom surface of the first depression region 70a.

As shown in FIG. 5D, the transfer electrodes 21 and 22 are formed on the ON film 70 (electrode forming process). FIG. 5D illustratively shows the transfer electrode 22. On the silicon oxide film 71, readout gate electrodes 31 (readout gate electrode line 30), discharge gate electrodes (discharge gate electrode line 40), and reset transistor gate electrode 63 are formed (electrode forming process). FIG. 5D illustratively shows the readout gate electrode 31.

To form the electrodes, first desired electrodes are formed using the 1-polysilicon layer and then second desired electrodes are formed using the 2-polysilicon layer.

To form the first desired electrodes using a 1-polysilicon layer, a 1-polysilicon layer is formed over the ON film 70 and the silicon oxide film 71. The 1-polysilicon layer can be formed by atmospheric CVD, reduced-pressure CVD, or the like. The polysilicon layer may be formed, for example, by thermally decomposing monosilane ($SiH_4$) at a temperature of about 500° C. to about 800° C.

Next, a resist pattern of a predetermined contour is formed on the 1-polysilicon layer by photolithography or the like.

Using the resist pattern as an etching mask, reactive ion etching is conducted on the 1-polysilicon layer to form desired contours of the 1-polysilicon layer. The 1-polysilicon layer formed into the desired contours serves as electrodes. The etching of the 1-polysilicon layer can be conducted in, for example, a chlorine-containing gas. The resist pattern is no longer necessary and is hence removed.

Surface of the electrode constituted with the 1-polysilicon layer is oxidized to form an oxidized surface-layer, i.e., a silicon oxide film. The ON film 70 has a nitride layer (silicon nitride layer 70nt) as an upper layer, which is hard to be oxidized. Therefore, when the surface of each electrode constituted with the 1-polysilicon layer is oxidized, oxygen atoms rarely enter the semiconductor substrate 1a and the oxide layer (silicon oxide layer 70ox) below the nitride layer (silicon nitride layer 70nt).

Thereafter, electrodes constituted with the 2-polysilicon layer are formed in desire d contours in almost the same way as for the electrodes constituted with the 1-polysilyicon layer. The solid-state image pickup device 100 can be produced through the above-described processes.

Figure 6:
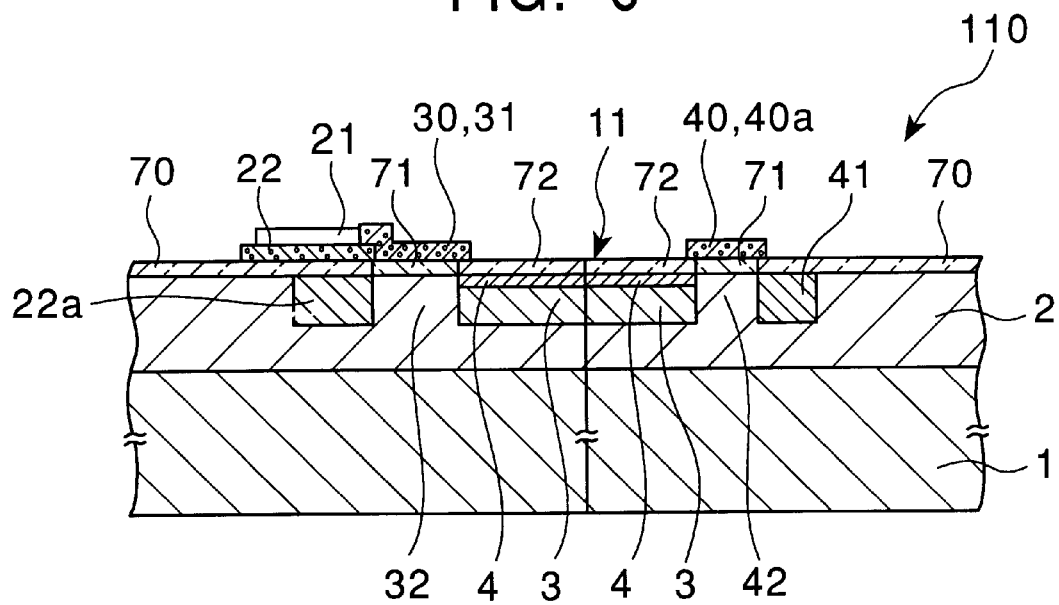
FIG. 6 is a cross-sectional view schematically showing a modification of the first embodiment.

Referring next to FIG. 6, description will be given of a modification of the first embodiment.

FIG. 6 schematically shows a cross-sectional view of a solid-state image pickup device 110 according to a modification of the first embodiment. The solid-state image pickup device 110 differs from the solid-state image pickup device 100 of the first embodiment in that each transfer electrode 22 is constituted with the 1-polysilicon layer and each transfer electrode 21 and the readout gate electrode line 30 are constituted with the 2-polysilicon layer. In the other configurations, the device 110 is the same as the device 100.

FIG. 6 schematically shows a cross section corresponding to a section of FIG. 1 along line IIIA—IIIA. In FIG. 6, the functionally same constituent components as those shown in FIG. 3A are assigned with the same reference numerals used in FIG. 3A and redundant description thereof will be avoided.

It will be possible that each transfer electrode 22 and the readout gate electrode line 30 are constituted with the 1-polysilicon layer and each transfer electrode 21 is constituted with the 2-polysilicon layer. It will be also possible that each transfer electrode 22 and the readout gate electrode line 30 are constituted with the 2-polysilicon layer and each transfer electrode 21 is constituted with the 1-polysilicon layer.

The solid-state image pickup device 100 of FIG. 1 and the solid-state image pickup device 110 of FIG. 6 are simply structured as a solid-state image pickup device for a line sensor.

In an actual solid-state image pickup device, a light shielding film is formed depending on cases to prevent unnecessary photoelectric conversion in areas other than the photoelectric converter elements. When necessary, a microlens array is disposed to increase photoelectric conversion efficiency of each photoelectric converter element. In a solid-state image pickup device for color images, a color filter array is arranged when necessary.

Figure 7:
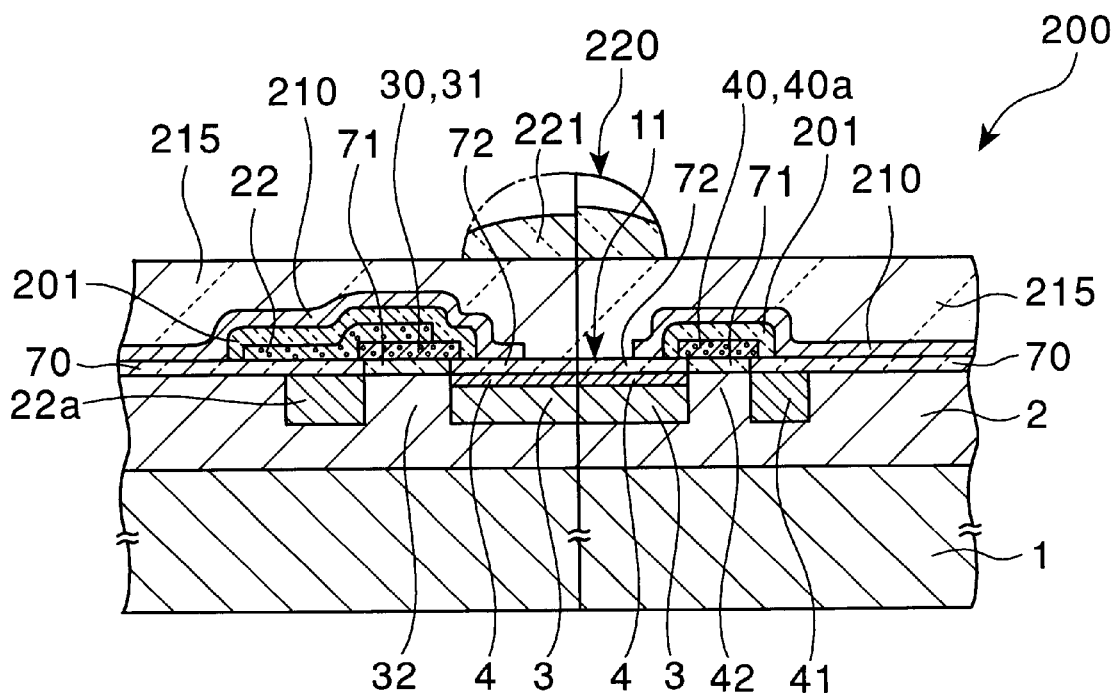
FIG. 7 is a cross-sectional view schematically showing a solid-state image pickup device according to a second embodiment.

FIG. 7 schematically shows a cross-sectional view of a solid-state image pickup device 200 according to a second embodiment. The solid-state image pickup device 200 differs from the solid-state image pickup device 100 in that a light shielding film 210 and a microlens array 220 are disposed. In the other configurations, the solid-state image pickup device 200 and 100 are equal to each other.

FIG. 7 shows a cross section corresponding to a section of FIG. 1 along line IIIA—IIIA. In FIG. 7, the same constituent components as those shown in FIG. 3A are assigned with the same reference numerals used in FIG. 3A and redundant description thereof will be avoided.

Also, the same constituent components as those of the solid-state image pickup device 100 are assigned with the same reference numerals in the description below.

In FIG. 7, the transfer electrodes 21 and 22, the readout gate electrode 30, the gdischare ate electrode line 40, the floating diffusion region 50, and the reset transistor 60 are covered with the light shielding film 210 in a plan view.

The light shielding film 210 has one light receiving opening 211 on each photoelectric converter element 11. Each light receiving opening 211 may be appropriately formed in a contour of a rectangle, a polygon with five or more edges, a circle, an ellipse, or the like in a plan view. The light receiving openings 211 are substantially equal in contour, size and direction to each other.

The light shielding film 210 is formed with a light shielding material. The film may be, for example, one of metallic thin films respectively of aluminum, chromium, tungsten, titanium, and molybdenum; one of alloy thin films of alloys made of at least two kinds of metals selected from the above-described metals, or one of multilayer metallic thin films made of a combination of the metallic thin films or a combination of one of the metallic thin films and one of the alloy thin films.

The light shielding film 210 is formed, for example, after an oxidized surface layer (silicon oxide film) 201 is formed on each transfer electrode 22 constituted with the 2-polysilicon layer. Also on a surface of each electrode constituted with the 1-polysilicon layer, an oxidized surface-layer (silicon oxidation film) 201 is formed. In FIG. 7, part of the oxidized surface-layer (silicon oxidation film) 201 formed on a surface of the readout gate electrode line 30 is not shown.

When necessary, a silicon nitride film (not shown) is formed on a surface of the light shielding film 210 by plasma CVD or the like. The silicon nitride film prevents contamination of the light shielding film 210 and each layer therebelow by water or the like permeated in the device.

A first planarizing film 215 is formed over the light shielding film 210 and over a surface of the photoelectric converter element 11 exposed in each light receiving opening 211. The first planarizing film 215 is formed, for example, with a transparent resin such as photo resist, for example, by spin coating.

On the first planarizing film 215, a microlens array 220 is arranged. The microlens array 220 is constituted with microlenses 221 equal in number to the photoelectric converter elements 11 of the photoelectric converter element group 10. Each microlens 221 may be appropriately formed in a contour of, for example, a rectangle (including a rhombus), a rectangular contour with corners rounded, a polygon which has five or more edges and of which each internal angle is an obtuse angle, a polygon contour obtained by rounding the corners of the above mentioned polygon, a circle, or an ellipse.

Each light receiving opening 211 is covered with one microlens 221 dedicatedly associated therewith. The first planarizing film 215 is also used as a focus-adjusting layer of each microlens 221.

In the forming of the microlenses 221, a layer of transparent resin (such as photo resist) having a refractive index of, for example, about 1.3 to about 2.0 is subdivided into partitions of a predetermined contour by photolithography. The resin of each partition is molten by heat treatment. After corners of the partition of the resin are rounded by its surface tension, the resin is cooled.

The solid-state image pickup device 200 is implemented by adding the light shielding film 210 and the microlens array 220 to the solid-state image pickup device 100 of the first embodiment.

Consequently, as in the case of the solid-state image pickup device 100, variations in the electric characteristics with a lapse of time can be easily suppressed in the solid-state image pickup device 200. When a plurality of solid-state image pickup devices 200 are produced, the variations in electric characteristics therebetween can be easily minimized.

Since the solid-state image pickup device 200 has the light shielding film 210, unnecessary photoelectric conversion in areas other than the photoelectric converter elements 11 can be prevented. The solid-state image pickup device 200 has the microlens array 220 and hence photoelectric conversion efficiency of each photoelectric converter element 11 is increased when compared with the solid-state image pickup device 100.

When the solid-state image pickup device 200 has a color filter array, the color filter array is formed on the first planarizing film 215. Therefore, after a second planarizing film is formed on the color filter array, the microlens array 220 is formed on a surface of the second planarizing film.

In the color filter array, a plurality of color filters to create color image are arranged in a predetermined pattern. Such a color filter array includes a color filter array, of three primary colors (red, green, blue) type and a color filer array of so-called complementary colors type.

A color filter array of complementary colors type can be formed using, for example, (i) color filters of green (G), cyan (Cy), and yellow (Ye); (ii) color filters of cyan (Cy), yellow (Ye), and white or colorless (W); (iii) color filters of cyan (Cy), magenta (Mg), yellow (Ye), and green (G); or (iv) color filters of cyan (Cy), yellow (Ye), green (G), and white or colorless (W).

The color filter array can be formed, for example, by disposing layers of colored resins each of which containing a desired pigment or dye, at a predetermined location by photolithography or the like.

The second planarizing film of a desired thickness can be formed, for example, with a transparent resin such as photo resist, for example, by spin coating.

Figure 8:
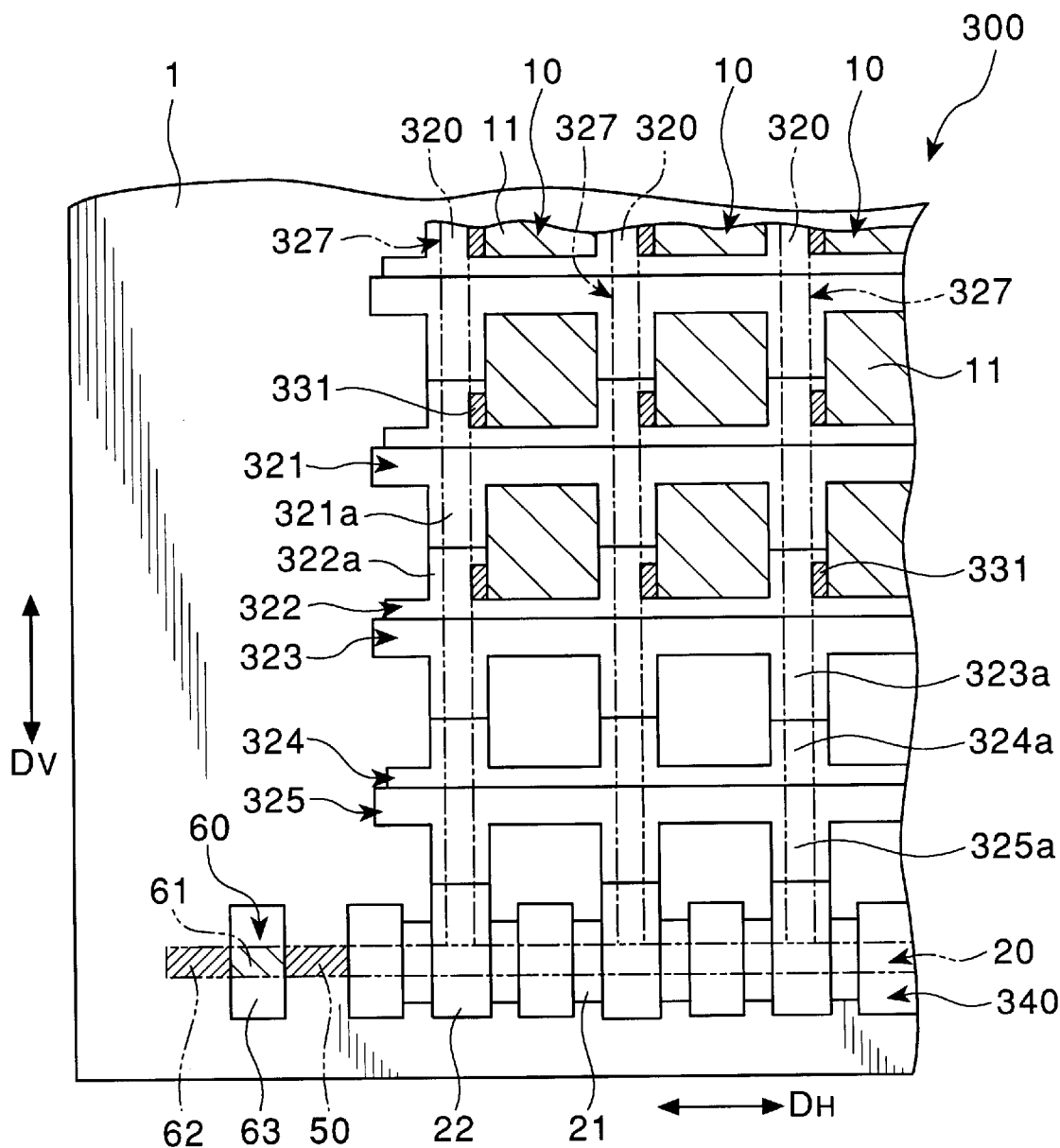
FIG. 8 is a schematic cross-sectional view partially showing a solid-state image pickup device according to a third embodiment.

Referring now to FIG. 8, description will be given of a solid-state image pickup device according to a third embodiment.

FIG. 8 schematically shows a solid-state image pickup device 300 of the third embodiment in a partial plan view. The solid-state image pickup device 300 is particularly suitable for solid-state image pickup device for an area image sensor.

The solid-state image pickup device 300 includes constituent components which are functionally the same as those of the solid-state image pickup device 100 of the first embodiment. In FIG. 8, the constituent components which are functionally the same as those shown in FIG. 1 will be assigned with the same reference numeral used in FIG. 1 and redundant description thereof will be avoided.

The solid-state image pickup device 300 has a plurality of photoelectric converter element groups 10. Each group includes a predetermined number of photoelectric converter elements (photodiodes) 11 formed in a column or line in one surface of a semiconductor substrate 1. Three photoelectric converter element groups 10 including one partially shown are shown in FIG. 8. Each photoelectric converter elements group 10 extends in a direction $D_y$ (indicated by an arrow mark in FIG. 8).

One photoelectric converter element group 10 has a large number of photoelectric converter elements 11. In an actual area image sensor has, for example, several hundred of thousand photoelectric converter elements 11 to several millions photoelectric converter elements 11. In the solid-state image pickup device 300, a large number of photoelectric converter elements 11 are disposed in a contour of a square matrix.

In this specification, the term "a square matrix" includes a matrix of which the number of rows and the number of columns are different from each other.

In FIG. 8, each photoelectric converter element 11 is hatched for easy understanding thereof.

For one photoelectric converter element group 10, one charge transfer channel 320 is formed on the left side of the group 10 in FIG. 8. Each charge transfer channel 320 can be formed, for example, by forming an n-type region in a band shape at a predetermined location of a p-type well constituting the semiconductor substrate 1. Each charge transfer channel 320 extends in the direction $D_v$.

For one row of photoelectric converter elements, one transfer dedicated electrode 321 and one read/transfer electrode 322 are formed in this order beginning at a position on an upstream side. On a downstream side of a photoelectric converter element row on a most downstream side, three auxiliary transfer electrodes 323 to 325 are formed. The transfer electrodes 321 to 325 are formed on the semiconductor substrate 1 with an insulating film therebetween and extend in a row direction $D_H$ (indicated by an arrow mark in FIG. 8).

Each transfer dedicated electrode 321 intersects the charge transfer channels 320 in a plan view. At each intersection, the transfer dedicated electrode 321 has a rectangular transfer stage forming section 321a projected to the downstream side. This is also the case with the auxiliary transfer electrodes 323 and 325. The transfer stage forming section in the auxiliary transfer electrode 323 is called a transfer stage forming section 323a, and the transfer stage forming section in the auxiliary transfer electrode 325 is called a transfer stage forming section 325a.

Each read/transfer electrode 322 intersects the charge transfer channels 320 in a plan view. At each intersection, the read/transfer electrode 322 has a rectangular transfer stage forming section 322a projected to the upstream side. This is also the case with the auxiliary transfer electrode 324. The transfer stage forming section in the auxiliary transfer electrode 324 is called a transfer stage forming section 324a.

Each transfer dedicated electrode 321 and the auxiliary transfer electrodes 323 , and 325 are formed using a 2-polysilicon layer. Each read/transfer electrode 322 and the auxiliary transfer electrode 324 are formed using a 1-polysilicon layer. The transfer electrodes constituted with the 1-polysilicon layer are electrically isolated from the transfer electrodes constituted with the 2-polysilicon layer by an oxidized surface-layer (silicon oxide film) formed on each transfer electrode constituted with the 1-polysilicon layer.

The transfer stage forming sections 321a, 322a, 323a, 324a, and 325a arranged on one charge transfer channel 320 constitute one charge transfer path 327 together with the charge transfer channel 320.

A readout gate region, not shown, is arranged for each photoelectric converter element 11 to be contiguous thereto. Each readout gate region is covered with the transfer stage forming section 322a of the read/transfer electrode 322 in a plan view.

The read/transfer electrode 322 is applied with, in addition to a driving pulse to transfer charge, a readout pulse to read signal charge from the photoelectric converter element 11 to the charge transfer path 327. A portion of each transfer stage forming section 322a covers the readout gate region. The portion functions as the readout gate electrode. The portion is to be referred to as a readout gate electrode section 331 herebelow.

In FIG. 8, each readout gate electrode section 331 is hatched for easy understanding thereof.

A downstream end of each charge transfer path 327 is connected to an output transfer path 340 being composed of a 2-phase driving type CCD. The output transfer path 340 is in structure substantially equal to the charge transfer path 25 shown in FIG. 1 excepting that the number of transfer electrodes varies therebetween. Therefore, the constituent components of the output transfer path 340 which are the same as those of the charge transfer path 25 of FIG. 1 are assigned with the same reference numerals, and description thereof will be avoided.

In the solid-state image pickup device 300, the insulating film below the transfer stage forming section 322a, the insulating film below each readout gate electrode section 331, and the insulating film below the gate electrode 63 of the reset transistor 60 are formed using a silicon oxide film, respectively.

The insulating film below the transfer stage forming section 321a, the insulating film below the transfer stage forming sections 323a, 324a, and 325a, and the insulating film below the transfer electrodes 21 and 22 are formed using an ON film, respectively.

Therefore, in the solid-state image pickup device 300, as in the solid-state image pickup 100, variations in the electric characteristics with a lapse of time can be easily suppressed. When a plurality of solid-state image pickup devices 300 are produced, variations in the electric characteristics between the solid-state image pickup devices 300 can be easily minimized.

Figure 9:
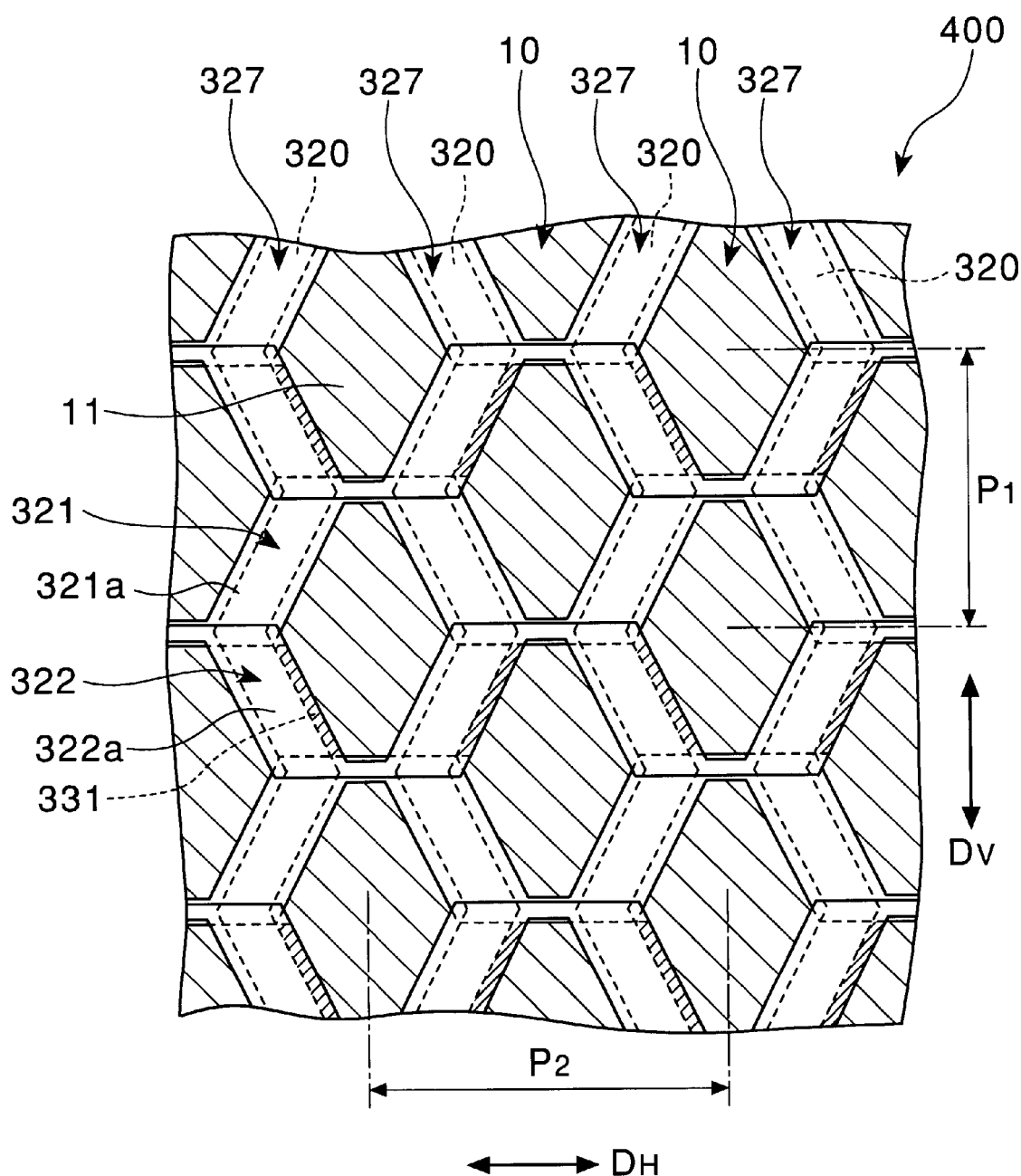
FIG. 9 is schematic cross-sectional view partially showing a solid-state image pickup device according to a fourth embodiment.

Referring now to FIG. 9, description will be given of a modification of the third embodiment.

FIG. 9 schematically and partially shows a magnified image of a solid-state image pickup 400 according to a modification of the third embodiment in a plan view.

The solid-state image pickup 400 shown in FIG. 9 differs from the solid-state image pickup 300 of the third embodiment in that (i) the photoelectric converter elements are arranged in a shifted-pixel layout and (2) each of the charge transfer paths formed for each associated one of the group of photoelectric converter elements has a meandering contour. The solid-state image pickup devices 400 and 300 are in the other points equal to each other. The constituent components shown in FIG. 9, which are functionally equal to those shown in FIG. 8 are assigned with the same reference numerals used in FIG. 8 and redundant description thereof will be avoided.

In the pixel-shifted layout in this specification, with respect to each photoelectric converter element 11 constituting an odd photoelectric converter element group 10, each associated photoelectric converter element 11 constituting an even photoelectric converter element group 10 is shifted in the direction $D_v$ by about one half of a pitch $P_1$ (FIG. 9) of the photoelectric converter elements 11 in each photoelectric converter element group 10. With respect to each photoelectric converter element 11 constituting an odd photoelectric converter element row, each associated photoelectric converter element 11 constituting an even photoelectric converter element row is shifted in a direction of row by about one half of a pitch $P_2$ (FIG. 9) of the photoelectric converter elements 11 in each photoelectric converter element row. Each photoelectric converter element group 10 includes photoelectric converter elements 11 of only odd or even rows.

The phrase "about one half of the pitch $P_1$ of the photoelectric converter elements" includes, in addition to $P_1/2$, any value which is different from $P_1/2$ because of factors such as a production error and a rounding error of a pixel position appearing in a design phase or a mask fabrication process and which nevertheless can be regarded as substantially equivalent to $P_1/2$ in consideration of obtained performance of the solid-state image pickup device and picture quality thereof. The phrase "about one half of the pitch $P_2$ of the photoelectric converter elements" is also to be similarly appreciated in this specification.

As shown in FIG. 9, when a transfer dedicated electrodes 321 and a readout/transfer electrode 322 adjacent thereto intersect a photoelectric converter element group 10, the transfer dedicated electrodes 321 overlap with the readout/transfer electrode 322. When the transfer dedicated electrodes 321 and the readout/transfer electrode 322 adjacent thereto intersect other photoelectric converter element group 10 next to the photoelectric converter element group 10, the transfer dedicated electrodes 321 and the readout/transfer electrode 322 are apart from each other to surround one photoelectric converter element 11 of the photoelectric converter element group 10.

The transfer dedicated electrodes 321 and the readout/transfer electrode 322 adjacent thereto generally extend in the direction $D_H$ while repeating the "meeting and parting" described above.

Also in the solid-state image pickup device 400, as in the solid-state image pickup device 300, the insulating film below the transfer stage forming section 322a and the insulating film below each readout gate electrode section 331 are constituted with a silicon oxide film. The insulating film below the transfer stage forming section 321a is constituted with an ON film.

Although not shown, the solid-state image pickup device 400 includes an output transfer path 340 (FIG. 8) as in the solid-state image pickup device 300.

The insulating film below the gate electrode 63 of the reset transistor 60 constituting the output transfer path 340 is formed using a silicon oxide film. The insulating film below the transfer electrodes 21 and 22 constituting the output transfer path 340 is formed using an ON film.

Consequently, in the solid-state image pickup device 400, variations in electric characteristics thereof with a lapse of time can be easily suppressed as in the solid-state image pickup device 100. When a plurality of the solid-state image pickup devices 400 are produced, variations in the electric characteristics between the solid-state image pickup devices 400 can be easily minimized.

Description has been given of embodiments of a solid-state image pickup device. However, the present invention is not limited to the embodiments. It is to be appreciated by those skilled in the art that various changes, modifications, and combinations are possible for the embodiments.

Particularly, excepting the materials and layout specifications of the insulating films to electrically isolate the electrodes from the semiconductor substrate, the structure can be changed in various ways according to uses and performance of the solid-state image pickup device to be produced. This is also the case with the method of driving the solid-state image pickup device.

For example, in a monochrome line sensor, two groups of photoelectric converter elements can also be formed in one column or line.

Figure 10:
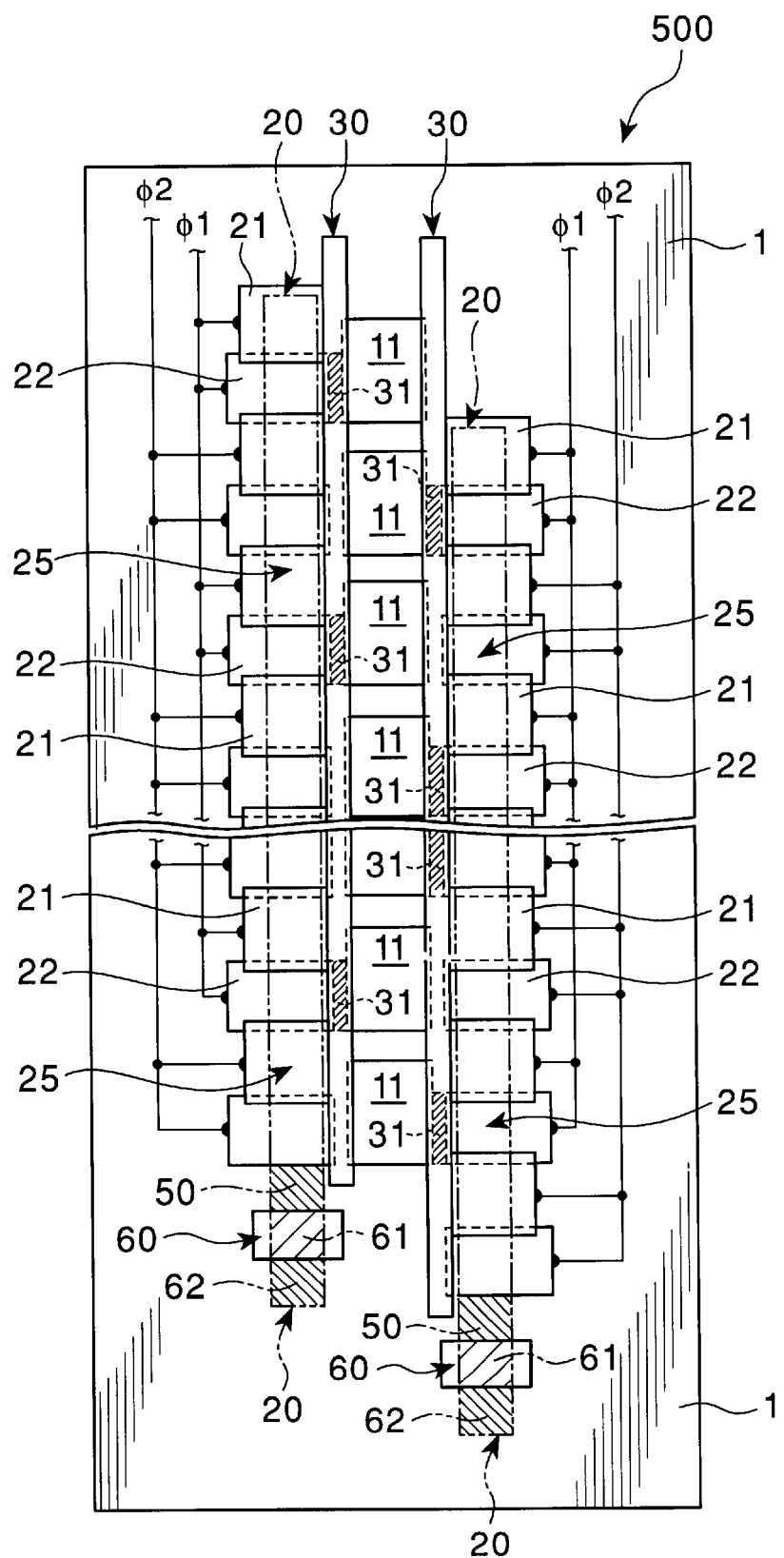
FIG. 10 is a schematic cross-sectional view partially showing a solid-state image pickup device according to a fifth embodiment.

FIG. 10 schematically shows a plan view of a solid-state image pickup device 500 according to a fourth embodiment. In FIG. 10, the functionally same constituent components as those shown in FIG. 1 are assigned with the same reference numerals used in FIG. 1 and redundant description thereof will be avoided.

In the solid-state image pickup device 500, of a large number of photoelectric converter elements 11 arranged in one column, odd-numbered ones relative to, for example, a most upstream position constitute one photoelectric converter element group and even-numbered ones constitute another photoelectric converter element group. For each of the photoelectric converter element groups, one charge transfer path 25 is disposed.

For example, each transfer electrode 22 is formed with a 1-polysilicon layer and each transfer electrode 21 is formed with a third polycrystalline silicon (3-polysilicon) layer. Each readout gate electrode line 30 is formed with a 2-polysilicon layer. Each readout gate electrode 31 is constituted using a region of the readout gate electrode line 30 having a contour of a band. In FIG. 10, each readout gate electrode 31 is hatched.

Neither the discharge drain region nor the discharge gate electrode line is disposed. When necessary, a vertical overflow drain may be disposed.

For example, by arranging four photoelectric converter element groups in a parallel layout, a line sensor for color image pickup and monochrome image pickup can be implemented.

Figure 11:
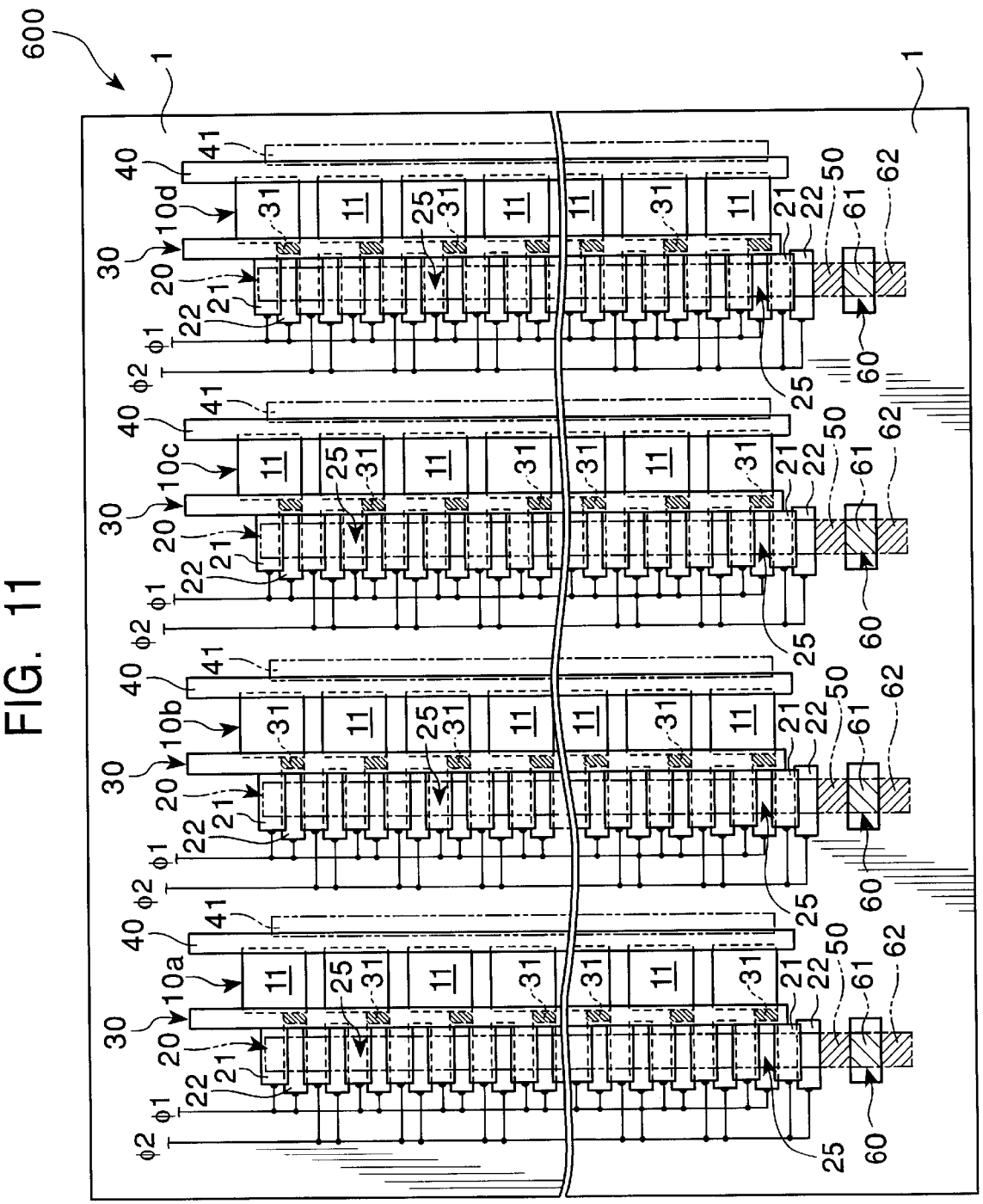
FIG. 11 is a schematic plan view partially showing a sixth embodiment of a solid-state image pickup device.

FIG. 11 schematically shows a plan view of a solid-state image pickup device 600 according to a fifth embodiment. The constituent components having the same function as those shown in FIG. 11 are already shown in FIG. 10. The functionally same constituent components as those shown in FIG. 10 are assigned with the same reference numerals in FIG. 11. Also in the description below, redundant description of the functionally same constituent components will be avoided.

The solid-state image pickup device 600 has three photoelectric converter element groups 10a, 10b, and 10c for color image pickup and one photoelectric converter element group 10d for monochrome image pickup. Although not shown in FIG. 11, color filters are arranged, namely, a red filter is formed over the photoelectric converter element group 10a, a green filter is formed over the photoelectric converter element group 10b, and a blue filter is formed over the photoelectric converter element group 10b. Also a color filter is formed over the photoelectric converter element group 10d.

Figure 12:
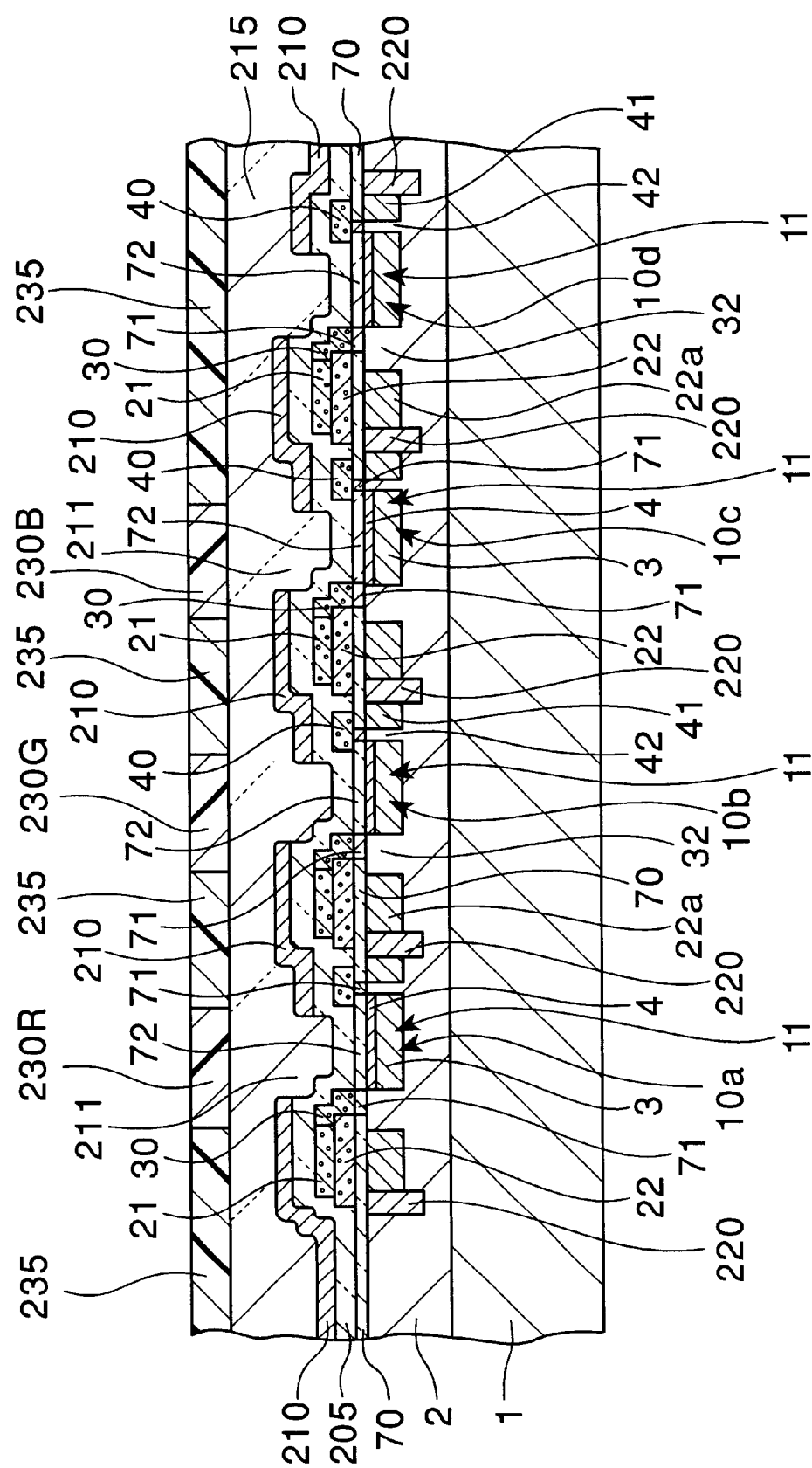
FIG. 12 a schematic cross-sectional view partially showing the sixth embodiment of a solid-state image pickup device.

FIG. 12 schematically shows a partial cross-sectional view of the solid-state image pickup device 600. In FIG. 12, the functionally same constituent components as those shown in FIG. 7 or 11 are assigned with the same reference numerals used in FIG. 7 or 11 and redundant description thereof will be avoided.

In the solid-state image pickup device 600 shown in FIG. 12, a passivation film 205 is formed such that the transfer electrodes 21 and 22, the readout gate electrode lines 30, the discharge gate electrode lines 40, the ON films 70, and the silicon oxide films 72 are coated with the passivation film 205. On the passivation film 205, a light shielding film 210 is disposed.

The passivation film 205 is formed using, for example, silicon nitride, silicon oxide, phosphosilicate glass (PSG), borophosphosilicate glass (BPSG), or polyimide.

Although not shown in FIG. 12, an oxidized surface-layer (silicon oxide film) is formed on each transfer electrode 21, each transfer electrode 22, each readout gate electrode line 30, and each discharge gate electrode line 40.

A first planarizing film 215 is formed on the light shielding film 210 and on the passivation film 205 exposed in each light receiving opening 211.

On the first planarizing film 215, a red filter 230R, a green filter 230G, and a blue filter 230B are arranged. The red filter 230R is over a photoelectric converter element group 10a, the green filter 230G is over the photoelectric converter element group 10b, and the blue filter 230B is over the photoelectric converter element group 10c. These color filters 230R, 230G, and 230B each have a contour of a stripe. For each photoelectric converter element group, each associated photoelectric converter element is covered with the associated color filter in a plan view.

On a surface (an upper surface) of the first planarizing film 215, a color filter 235 is disposed in an area other than the color filters 230R, 230G, and 230B. Therefore, the color filter 235 is disposed over the photoelectric converter element group 10d.

The color filter 235 over the photoelectric converter element group 10d is a color filter of chromatic color or an achromatic color other than black. The color filters 235 at the other locations are color filters of chromatic color or an achromatic color including black.

However, it is not necessarily required to dispose a color filter over each photoelectric converter element of the photoelectric converter element group 10d. In place of the color filter 235, a transparent layer may be disposed.

In the solid-state image pickup device 600, according to signal charge which is read from the photoelectric converter elements 11 of the photoelectric converter element groups 10a to 10c and which is fed to the associated charge transfer paths 25, an image signal for color image can be obtained. In accordance with signal charge which is read from the photoelectric converter elements of the photoelectric converter element group 10d and which is fed to the associated charge transfer path 25, an image signal for monochrome image can be obtained.

In the embodiments above, an ON film and an oxide film (silicon oxide film) are formed on a semiconductor substrate. However, an ONO film may be used in place of the ON film.

Figure 13:
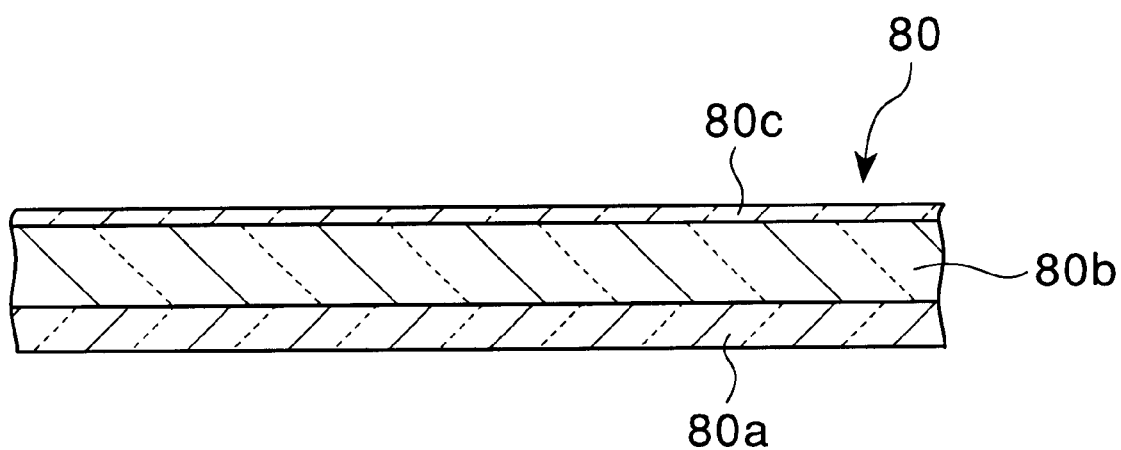
FIG. 13 is a cross-sectional view schematically showing an ONO film.

As shown in FIG. 13, an ONO film 80 can be formed, for example, by accumulating a silicon oxide layer 80a, a silicon nitride layer 80b, and a silicon oxide layer 80c on a semiconductor substrate in this order.

The silicon oxide layer 80a of a bottom layer (on the semiconductor substrate side) of the ONO film 80 may appropriately has a thickness ranging from about 100 Å to about 500 Å (about 10 nm to about 50 nm). The silicon nitride layer 80b may appropriately have a thickness ranging from about 200 Å to about 700 Å (about 20 nm to about 70 nm). The silicon oxide layer 80c of a top layer of the ONO film 80 may appropriately has a thickness ranging from about 30 Å to about 100 Å (about 3 nm to about 10 nm). The ONO film 80 has a thickness ranging from 300 Å to about 1000 Å (about 30 nm to about 100 nm).

The ONO film 80 is formed, for example, as follows. A silicon oxide layer 80a and a silicon nitride layer 80b are formed in almost the same way as for the associated layers of the ON film. On the silicon nitride layer 80b, a silicon oxide layer 80c is formed by thermal oxidation or the like.

The silicon oxide layer 80c can be formed, for example, in dry oxidizing atmosphere at a temperature ranging from 900° C. to 1100° C.

Other various changes, modifications, and combinations may possible for the embodiments.

In accordance with the present invention, there is provided a solid-state image pickup device in which variations in electric characteristics can be easily suppressed.

What I claimed are:

1. A solid-state image pickup device, comprising:
   a semiconductor substrate;
   a photoelectric converter element group including a plurality of photoelectric converter elements formed in one column in one surface of said semiconductor substrate;
   a charge transfer channel formed in said semiconductor substrate, said charge transfer channel being adjacent to said photoelectric converter element group;
   a readout gate region formed for each said photoelectric converter element, each said readout gate region being contiguous to said associated photoelectric converter element and to said charge transfer channel;
   a plurality of transfer electrodes formed over said charge transfer channel with an ON film or an ONO film therebetween, each said transfer electrode intersecting said charge transfer channel in a plan view, said transfer electrodes being formed adjacent to each other and constituting one charge transfer path together with said charge transfer channel; and
   a readout gate electrode formed for each said readout gate region and being electrically independent from said transfer electrodes, each said readout gate electrode being formed over said associated readout gate region with a non-ON or non-ONO oxide insulating film therebetween, said readout gate electrodes being electrically connected to each other to form one electrode line.

2. A solid-state image pickup device according to claim 1, further comprising:
   one discharge drain region formed in said semiconductor substrate, said discharge drain region extending along said photoelectric converter element group;
   a discharge gate region formed in said semiconductor substrate for each said photoelectric converter element, each said discharge gate region being contiguous to said associated photoelectric converter element and to said discharge drain region; and
   a discharge gate electrode formed for each said discharge gate region, each said discharge gate electrode being formed over said associated discharge gate region with an oxide insulating film therebetween, said discharge gate electrodes being electrically connected to each other to form one electrode line.

3. A solid-state image pickup device according to claim 1, further comprising:
   a reset transistor including a downstream end section of said charge transfer channel,
   said reset transistor including a gate electrode formed on said charge transfer channel with an oxide film therebetween.

4. A solid-state image pickup device according to claim 1, wherein said oxide insulation film is made of silicon oxide.

* * * * *